US011749455B2

(12) United States Patent
Cobian et al.

(10) Patent No.: US 11,749,455 B2
(45) Date of Patent: Sep. 5, 2023

(54) METHODS OF FABRICATING ULTRA-MINIATURE LAMINATED MAGNETIC CORES AND DEVICES

(71) Applicant: BH Electronics, Inc., Burnsville, MN (US)

(72) Inventors: Ryan K. Cobian, New Brighton, MN (US); Richard H. Jackson, Plymouth, MN (US); Scott B. Conklin, Prior Lake, MN (US)

(73) Assignee: BH Electronics, Inc., Burnsville, MN (US)

( * ) Notice: Subject to any disclaimer, the term of this patent is extended or adjusted under 35 U.S.C. 154(b) by 27 days.

(21) Appl. No.: 17/571,886

(22) Filed: Jan. 10, 2022

(65) Prior Publication Data

US 2023/0223190 A1    Jul. 13, 2023

(51) Int. Cl.
| H01F 7/06 | (2006.01) |
| H01F 41/02 | (2006.01) |
| G03F 7/00 | (2006.01) |
| H01F 1/147 | (2006.01) |

(52) U.S. Cl.
CPC ....... *H01F 41/0246* (2013.01); *G03F 7/0017* (2013.01); *H01F 1/147* (2013.01)

(58) Field of Classification Search
CPC ... H01F 41/0246; H01F 41/147; G03F 7/0017
See application file for complete search history.

(56) References Cited

U.S. PATENT DOCUMENTS

| 3,833,872 A | 9/1974 | Marcus et al. |
| 3,874,075 A | 4/1975 | Lohse |
| 4,649,639 A | 3/1987 | Mas |
| 4,847,986 A | 7/1989 | Meinel |
| 4,927,804 A | 5/1990 | Zieren et al. |
| 5,070,317 A | 12/1991 | Bhagat |
| 5,097,243 A | 3/1992 | Zieren et al. |
| 5,398,400 A | 3/1995 | Breen |
| 5,420,558 A | 5/1995 | Ito et al. |
| 5,539,369 A | 7/1996 | Selker et al. |
| 5,572,179 A | 11/1996 | Ito |

(Continued)

FOREIGN PATENT DOCUMENTS

JP    S6442110    2/1989

*Primary Examiner* — Paul D Kim
(74) *Attorney, Agent, or Firm* — Christensen, Fonder, Dardi & Herbert PLLC

(57) ABSTRACT

A method of fabricating a laminated magnetic core including: fabricating a magnetic-core mold on a surface, the magnetic-core mold including a first wall portion having a first sidewall, a second wall portion having a second sidewall, the second sidewall located opposite the first sidewall, the first and second sidewalls and a portion of the surface defining a mold cavity having a bottom width that is greater than a top width; depositing a seed material on the mold top surface and on a portion of the surface so as to form a conductive layer, wherein the seed material is directed toward the mold top surface and the portion of the surface of the substrate at an angle of incidence that substantially prevents deposition of the seed material on the first and second sidewalls; forming a magnetic layer on the conductive layer; and forming an insulating-sealing layer on the magnetic layer.

29 Claims, 9 Drawing Sheets

(56) References Cited

U.S. PATENT DOCUMENTS

| | | | |
|---|---|---|---|
| 5,583,474 A | | 12/1996 | Mizoguchi et al. |
| 5,585,986 A | | 12/1996 | Parkin |
| 5,801,521 A | | 9/1998 | Mizoguchi et al. |
| 5,969,422 A | * | 10/1999 | Ting .................. H01L 21/76846 257/769 |
| 6,008,102 A | | 12/1999 | Alford et al. |
| 6,148,500 A | | 11/2000 | Krone et al. |
| 6,197,439 B1 | | 3/2001 | Parkin et al. |
| 6,240,622 B1 | | 6/2001 | Ahn et al. |
| 7,107,666 B2 | * | 9/2006 | Hiatt .................. H01F 17/0033 29/603.24 |
| 9,121,106 B2 | * | 9/2015 | Lee .......................... C23C 28/34 |
| 10,283,249 B2 | | 5/2019 | Deligianni et al. |
| 10,811,177 B2 | | 10/2020 | Doris et al. |
| 11,018,050 B2 | | 5/2021 | Kim et al. |
| 11,018,085 B2 | | 5/2021 | Inoue et al. |
| 11,018,134 B2 | | 5/2021 | Lin et al. |
| 2006/0231288 A1 | * | 10/2006 | Vanfleteren ............ H05K 3/205 174/250 |
| 2011/0131798 A1 | | 6/2011 | Papavasiliou |
| 2011/0279214 A1 | | 11/2011 | Lee et al. |
| 2013/0224887 A1 | | 12/2013 | Linden et al. |
| 2015/0187488 A1 | | 7/2015 | Williams et al. |
| 2016/0163443 A1 | | 6/2016 | Erturk et al. |

\* cited by examiner

METHODS OF FABRICATING ULTRA-MINIATURE LAMINATED MAGNETIC CORES AND DEVICES

FIELD OF THE INVENTION

The present invention relates to ultra-miniature magnetic cores for transformers and inductors that are fabricated with high-volume semiconductor/micro-electromechanical systems (MEMS) technology production processes.

BACKGROUND OF THE INVENTION

The continuing trend for portable electronic devices is increasing the pressure to miniaturize power and communication systems. To meet this demand, integrated circuit (IC) manufacturers are developing electrical systems in self-contained packages. These are complete micro-sized system-in-package (µSiP) power and signal management solutions with integrated controllers, power transistors, capacitors, and magnetic components within a compact surface mount ball grid array (BGA) or land grid array (LGA) package. In many cases, all of the components in the µSiP are similar in size (footprint & height) to the controller ICs with the exception of the much larger transformers and inductors. IC manufacturers would significantly benefit from ultra-miniature inductors and transformers comparable in size to ICs to integrate within µSiPs.

Magnetic components being miniaturized for use in µSiPs require high saturation, low-loss magnetic cores in order to operate efficiently. Low operating efficiency due to core loss is the main problem preventing the adoption of ultra-miniature magnetic devices. Current methods of producing high saturation, low loss magnetic cores are either incompatible with semiconductor fabrication processes, or they drive up the cost of the ultra-miniature inductors and transformers past the point where they would be competitive.

SUMMARY OF THE INVENTION

Embodiments of the invention include methods and systems for manufacturing small-sized, or "ultra-miniature" magnetic devices having low-loss, high energy density magnetic cores using high-volume semiconductor processes. Methods of the invention yield much smaller feature sizes than are possible with traditional manufacturing techniques. In addition, the inventive semiconductor processing techniques allow for automated manufacturing with statistical process control, significantly enhancing product quality as compared to current manufacturing techniques.

Ultra-miniature inductors and transformers of the disclosed invention will much more closely match the size of the other components in the µSiP thereby reducing the size of the package and improving reliability. These devices will allow semiconductor product manufacturers to create signal and power management systems with greatly reduced size and weight. This technology will lead to more fully-featured, smaller, higher-quality, lower cost communications and computing products.

Embodiments of the invention include methods of core fabrication that allow a magnetic core to be self-patterned during deposition. This inventive fabrication technique allows a highly-laminated magnetic core to be fabricated using only a single photolithography step at the beginning of the process. Therefore, it avoids the expense of added photolithography steps for each lamination that drive up device cost.

In an embodiment, the invention comprises a method of fabricating a laminated magnetic core that includes: fabricating a magnetic-core mold on a surface, the magnetic-core mold including a first wall portion having a first sidewall, a second wall portion having a second sidewall, the second sidewall located opposite the first sidewall, and a top portion, the first and second sidewalls and a portion of the surface defining a mold cavity having a bottom width that is greater than a top width the first and second sidewalls connecting the top portion of the mold to the surface; depositing a conductive seed material on the mold top portion and on a portion of the surface so as to form a conductive layer of the laminated magnetic core, wherein the conductive seed material is directed toward the mold top portion and the portion of the surface, at an angle of incidence that substantially prevents deposition of the conductive seed material on the first and second sidewalls; forming a magnetic layer on the conductive layer; and forming an insulating-sealing layer on the magnetic layer.

In another embodiment, the invention comprises a method of fabricating a laminated magnetic core that includes a conductive layer, a magnetic layer and an insulating-sealing layer, the method including: fabricating a magnetic-core mold on a surface using photolithography, the magnetic-core mold comprising a negative photoresist material and including a first wall portion having a first sidewall, a second wall portion having a second sidewall, the second sidewall located opposite the first sidewall, and a top portion, the first sidewall forming a first angle relative to the surface, the second sidewall forming a second angle relative to the surface, both the first angle and the second angle being less than 90°; depositing a conductive seed material on the mold top portion and on a portion of the surface between the first sidewall and the second sidewall so as to form a conductive layer of the laminated magnetic core; forming a magnetic layer on the conductive layer; dissolving the deposited conductive seed material on the mold top portion; applying an adhesive material to the magnetic layer; and forming a first insulating-sealing layer comprising parylene on the adhesive-coated magnetic layer, thereby forming a laminated core having a first lamination layer that includes the conductive layer, the magnetic layer and the insulating-sealing layer.

The method further includes fabricating a second lamination layer of the laminated magnetic core on the first lamination layer. Fabrication of the second lamination layer may include: depositing conductive seed material on the mold top portion and on the first insulating-sealing layer so as to form a second conductive layer; forming a second magnetic layer on the second conductive metal layer; applying adhesive material to the second magnetic layer; and forming a second insulating-sealing layer on the adhesive-coated second magnetic layer, thereby fabricating a second lamination layer on the first lamination layer.

The method may also include forming a coil winding around the first and second lamination layers.

The magnetic device may be one of a transformer, inductor, choke or other magnetic device.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure. The invention can be understood in consideration of the following detailed description of various embodiments of the invention in connection with the accompanying drawings, in which.

DETAILED DESCRIPTION

Figure 1:
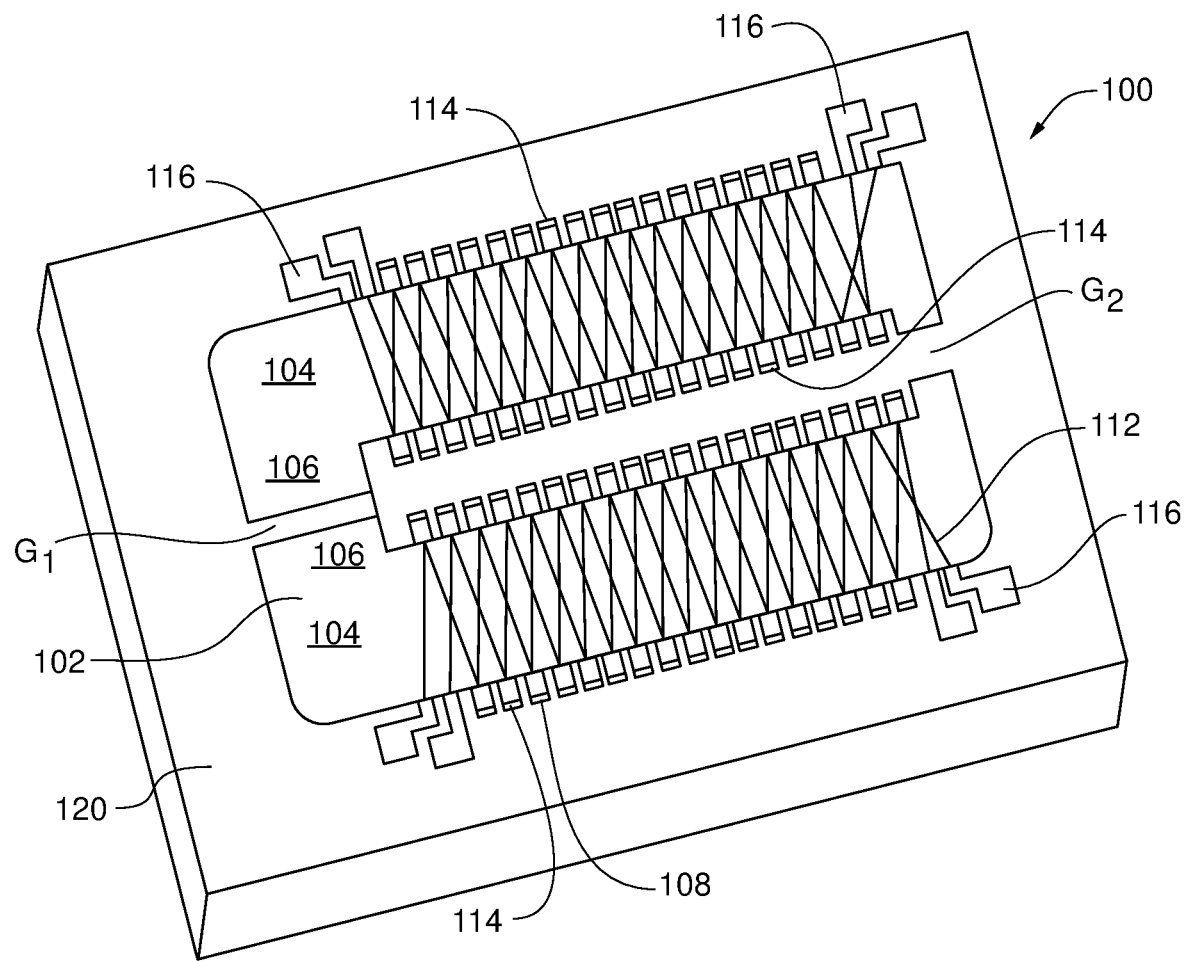
FIG. 1 is perspective view of an ultra-miniature magnetic device with an ultra-miniature magnetic core, according to an embodiment of the disclosure.

Embodiments of the invention include high performance, cost-effective magnetic cores that are compatible with semiconductor manufacturing processes used to manufacture ultra-miniature transformers and inductors for incorporation in devices such as μSiPs. There are two ways to decrease the size of magnetic components in electronic systems. First, the switching frequency of the magnetic devices can be increased. This decreases the amount of energy processed during each switching cycle. Second, is to increase the energy density of the magnetic cores. This increases the amount of energy that can be processed during each switching cycle. To miniaturize magnetic components, high energy density cores are needed that can operate efficiently at high frequencies.

The amount of energy that can be stored in a magnetic core is a function of the saturation magnetization and permeability of the core. While the maximum flux density is determined by the saturation magnetization of the material, the relative permeability is strongly influenced by the geometry of the cores. It is common practice to gap cores in order to reduce the relative permeability and increase energy density. In order to maximize energy density, magnetic cores need high saturation flux densities. Ultra-miniature magnetic devices require high-saturation magnetizations in order to be as compact as possible.

As described further below, certain embodiments of laminated ultra-miniature magnetic cores of the invention have saturation magnetization of around 1.5 Tesla (T). Such saturation is 3 to 5 times larger than saturation magnetizations typically seen in bulk ferrite cores, as evidenced by Table I below. For example, in an embodiment of an ultra-miniature core manufactured according to embodiments of the invention using a $Ni_{45}Fe_{55}$ magnetic material demonstrates a saturation magnetization of 1.6 T. Such micro-fabricated cores could be up to 5 times smaller than cores made of typical ferrite materials and yet handle the same amount of magnetic flux.

TABLE I

Core Magnetic Materials and Properties

| Magnetic Material | Fabrication Technique | $B_s$ (T) | $H_c$ (Oe) | Permeability | Resistivity ($\mu\Omega \cdot cm$) |
|---|---|---|---|---|---|
| MnZn Ferrite | Sintered (Bulk) | 0.3-0.5 | | 750-15000 | $10^7$-$10^8$ |
| NiZn Ferrite | Sintered (Bulk) | 0.3-0.5 | | 10-1500 | $10^{12}$ |
| NiZnFeO | Screen Printed | 0.23 | 17.5 | 25 | 108 |
| NiZnFeO | Screen Printed | 0.65 | 70 | 60 | 108 |
| CoHfTaPd | Sputtered | 1.0 | 0.5 | | 170 |
| CoZrTa | Sputtered | 1.44 | 0.4 | 500 | 100 |
| CoZrO | Sputtered | 0.9 | 3 | 80 | 2000 |
| CoZrO | Sputtered | 1.3 | 1 | 80 | 600 |
| $Co_{90}Fe_{10}$ | Electroplated | 1.9 | 1.0 | 2000 | 10 |
| $Co_{65}Ni_{12}Fe_{23}$ | Electroplated | 2.1 | 1.20 | 600 | 21 |
| $Ni_{80}Fe_{20}$ | Electroplated | 0.8 | 3 | 2000 | 20 |
| $Ni_{45}Fe_{55}$ | Electroplated | 1.5 | 0.5 | 280 | 45 |
| $Ni_{80}Fe_{20}$ | Electroplated | 1.0 | 0.5 | 5500 | 24 |
| $Ni_{45}Fe_{55}$ | Electroplated | 1.6 | 0.6 | 2900 | 45 |

Electroplating is ideal for thick film (1-100 um) structures due to its high deposition rate which can be as much as several microns per minute. The main disadvantage of electroplated magnetic films is their low resistivity. Due to the nature of electrodeposition, it is primarily used to deposit conductive materials. Nickel, iron, and cobalt alloys are readily electroplatable to several hundred microns, but they all have resistivities less than 50 $\mu\Omega \cdot cm$. Therefore, they are susceptible to large core losses especially as the frequency of operation increases.

The thickness of the core is generally limited to the skin depth of the material at the frequency of operation to minimize core losses. Since the skin depth of ferrites is high due to their high resistivity, they are conventionally used for high frequency magnetics despite their low saturation magnetization. The general relationship between skin depth and frequency is:

$$\delta = \sqrt{\frac{\rho}{\pi f \mu_r \mu_o}}$$

Where, δ=Skin Depth, ρ=Resistivity of the Material, f=Frequency, $\mu_r$=Relative Permeability, and $\mu_o$=Permeability Constant=$4\pi \times 10^{-7}$.

Alternatively, rather than conventional ferrite cores, laminated magnetic cores can be used to increase the performance of metallic magnetic cores. Laminated cores use stacks of thin magnetic material, such as magnetic layers 186/188 described below, that are electrically isolated from each other. In order to maximize the efficiency of laminated cores, the thickness of the laminations is generally limited to the skin depth of the material.

Embodiments of a laminated core of the present invention intended for use in high-frequency applications may include magnetic layer materials such as an alloy of nickel and iron, such as an 80% nickel, 20% iron, material, or permalloy. Other materials may include a cobalt-iron alloy, or a cobalt-nickel-iron alloy. Skin depth vs. frequency characteristics of permalloy is described in Table II below:

TABLE II

Permalloy Skin Depth
Resistivity (μOhm-cm) 20
Permeability 2000

| Frequency (MHz) | Skin Depth (Microns) |
| --- | --- |
| 0.1 | 15.9 |
| 1 | 5.0 |
| 10 | 1.6 |
| 100 | 0.5 |
| 1000 | 0.2 |
| 10000 | 0.1 |

In contrast to typical magnetic cores, embodiments of the present invention comprise methods of electroplating high resistivity, high saturation core materials at the thickness necessary for ultra-miniature magnetic devices. Ultra-miniature devices that include such cores of the present invention can be up to five times smaller than a traditional device with a bulk ferrite core, while still maintaining the same energy storage capacity.

Ultra-miniature inductors and transformers must also have magnetic cores that maintain their performance at high frequencies. The factors that impact core efficiency at high frequencies are hysteresis loss and eddy current loss. Hysteresis loss is the energy lost switching the polarity of the magnetic material, and is directly related to the coercivity of the cores. Core losses due to eddy currents are a function of the resistivity of the cores, drive level, and frequency of operation. Highly-resistive magnetic cores inhibit the formation of eddy currents and can be operated at higher frequencies.

In order to reduce core losses and ensure efficient operation at high powers and frequencies, magnetic cores with low coercivity and high resistivity are necessary for ultra-miniature magnetic devices. As described further below, certain embodiments of magnetic cores of the present invention have coercivity and resistivity of <1 Oe and >500 μΩcm, respectively.

As also described further below, embodiments of the present invention include methods of fabricating magnetic devices and cores having the desired magnetic and electrical properties that are cost effective and compatible with high-volume semiconductor fabrication techniques. Embodiments include a new method of core fabrication that yields a highly-laminated magnetic core using only a single photolithography step at the beginning of the process, rather than using photolithographic techniques to fabricate each layer. Therefore, it avoids the expense of added photolithography steps that drive up device cost. Such methods yield a dramatic increase in core performance while keeping costs low.

FIG. 1 depicts an embodiment of an ultra-miniature device 100, configured as a transformer that includes inventive high-performance magnetic core 102. Device 100 generally includes a magnetic core 102, which as depicted, is in the configuration of an elongated rectangle or oval having two elongate sides 104 and two short sides 106, and a coil winding 108, which comprises a lower conductor and upper conductor 112 connected by conducting vias 114. Bonding pads 116 are provided on coil winding 108 for connection to external circuitry. Ultra-miniature magnetic device 100 is fabricated atop a silicon substrate 120 although other possible substrates such as glass, fiberglass, polyimide, ceramics and other insulating materials can be used. In the embodiment depicted, magnetic core 102 defines a pair of gaps, G1 and G2, but in other embodiments, magnetic core 102 may include more than two, only one gap or even no gaps.

Other embodiments of ultra-miniature magnetic devices 100 that include magnetic core 102 may include not only transformers, but inductors, chokes and other magnetic devices.

Methods of fabricating magnetic core 102 are described below with reference to FIGS. 2-15.

Figure 2:
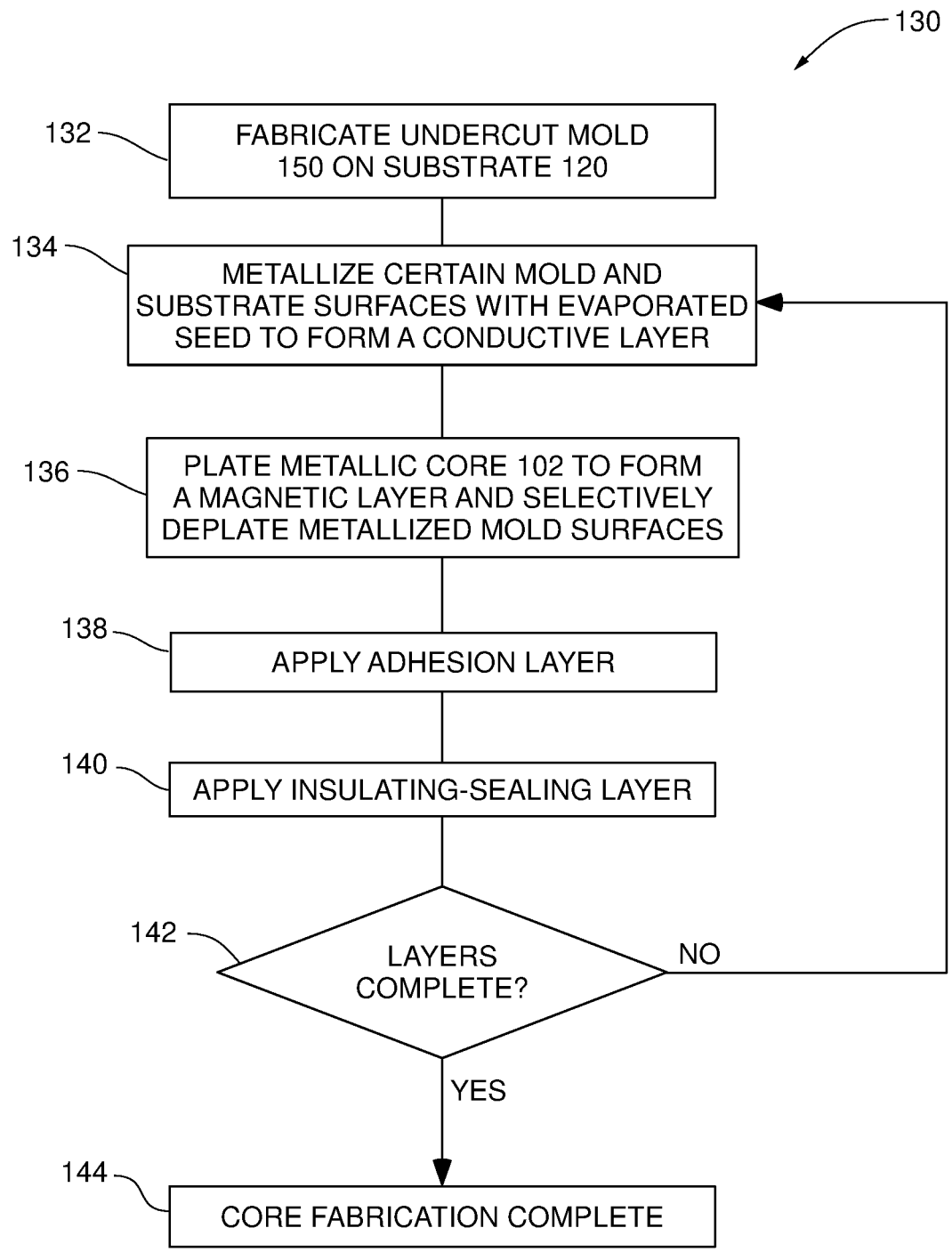
FIG. 2 is a flow diagram of a method of fabrication of an ultra-miniature magnetic core, according to an embodiment of the disclosure.

Referring specifically to FIG. 2, in an embodiment, a method 130 of laminating core 102 includes steps 132 to 144, which includes: fabricating mold 150 on substrate 120 at step 132; metallizing selected non-sidewall mold and substrate surfaces at step 134 to form a conductive layer; plating a magnetic layer of metallic core 102 and de-plating metallized mold surfaces at step 136; apply an adhesion layer at step 138; apply an insulating-sealing layer at step 140; and if more layers are required, per step 142, repeat steps 134 to 140 so as to add additional lamination layers to core 102. The process is complete at step 144 when the desired number of layers are added to core 102.

Figure 3:
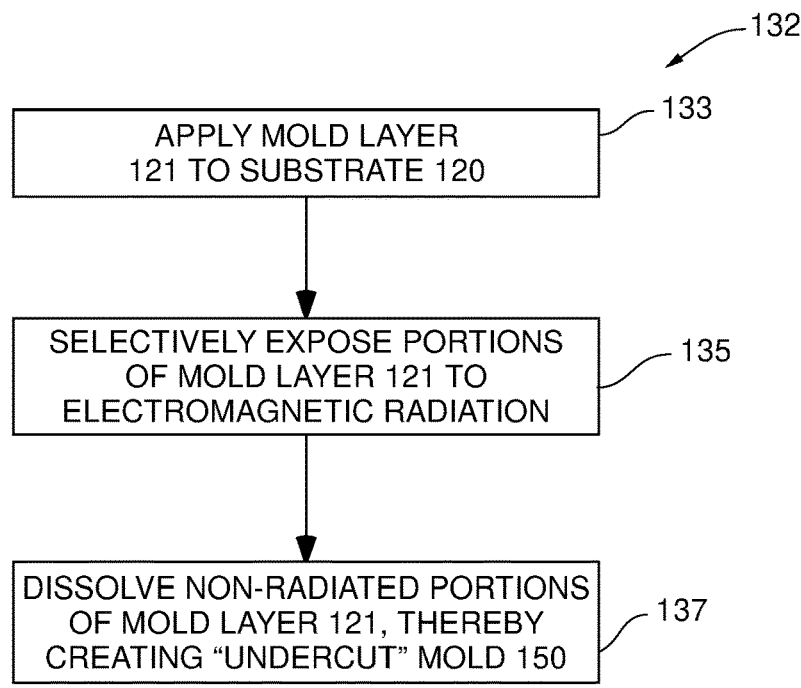
FIG. 3 is a flow diagram of a method of fabricating a mold for an ultra-miniature magnetic core, according to an embodiment of the disclosure.
Figure 4:
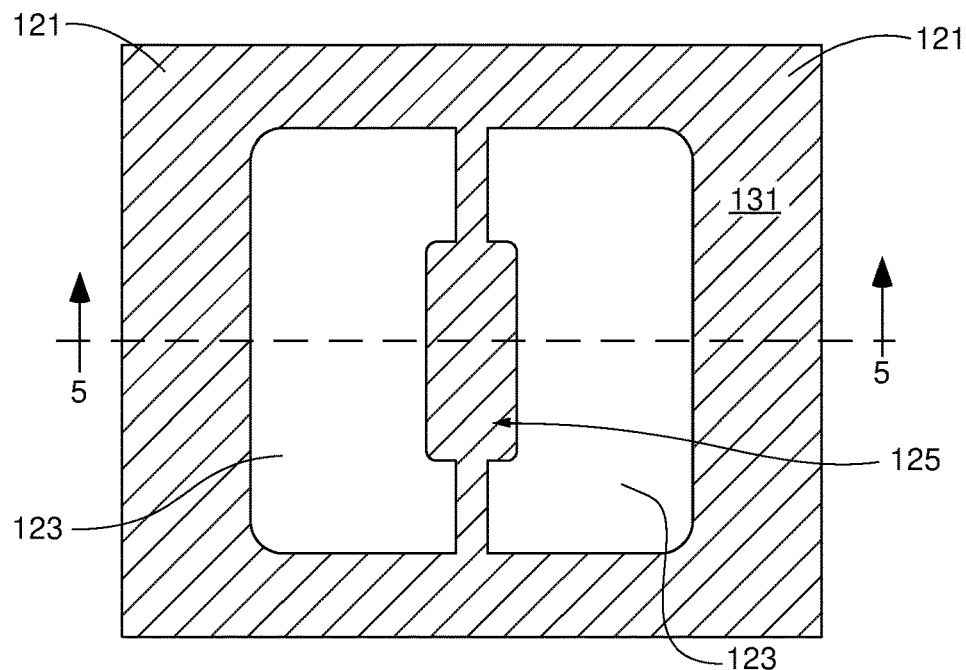
FIG. 4 is a schematic top-view depiction of a mask positioned over a mold layer, prior to irradiation, according to an embodiment of the disclosure.
Figure 5:
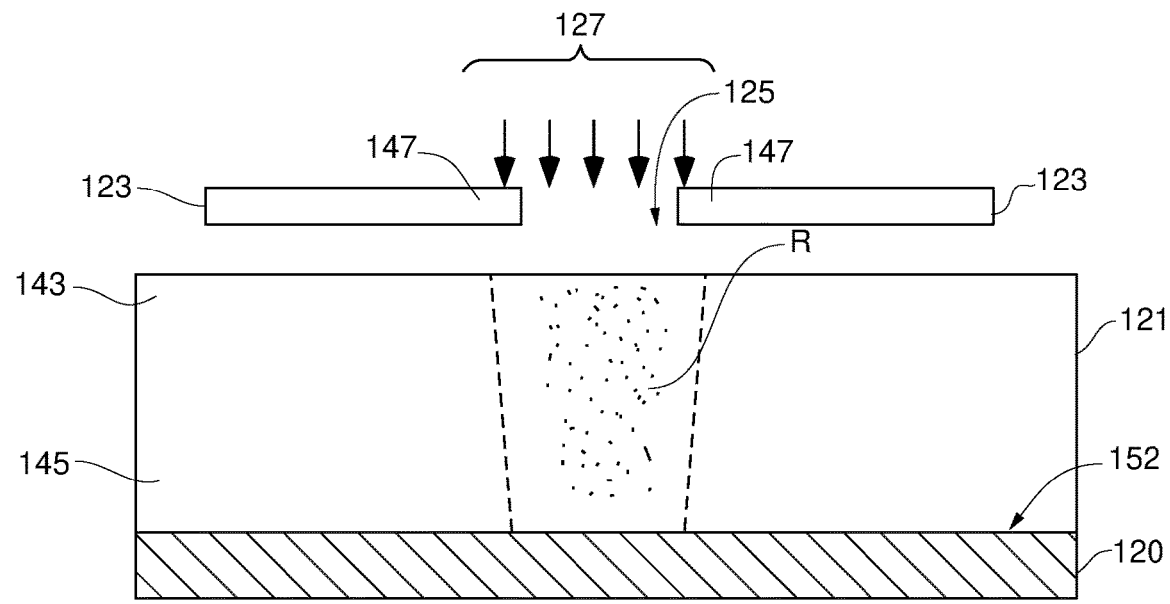
FIG. 5 is a cross-sectional view of FIG. 4 of the mold material being irradiated, according to an embodiment of the disclosure.
Figure 6:
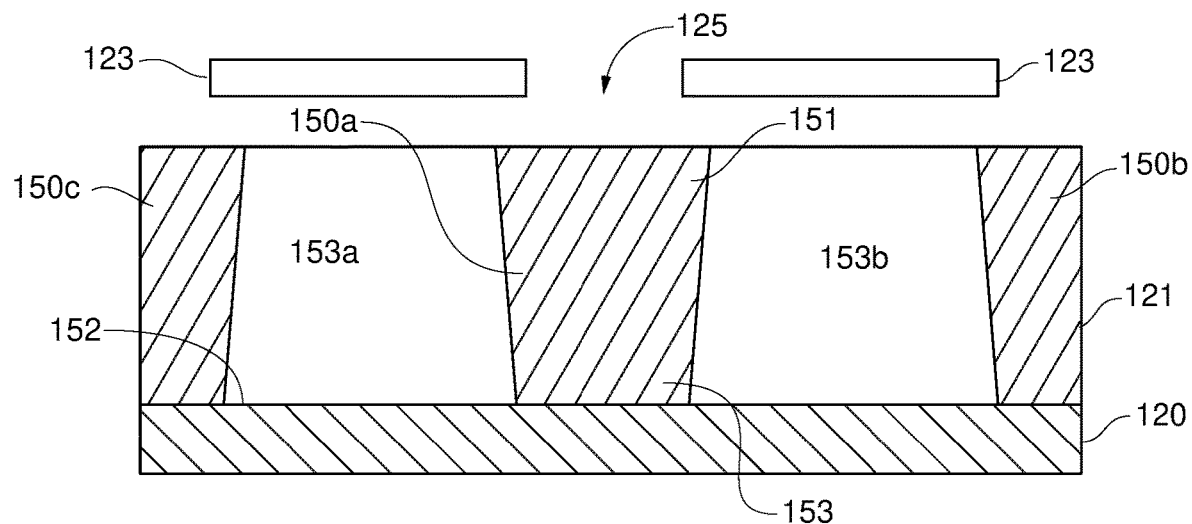
FIG. 6 is a cross-sectional view FIG. 4, with the mold material after irradiation, according to an embodiment of the disclosure.

Referring specifically to FIG. 3, step 132, fabricating or forming mold 150 on a surface of substrate 120, is described in further detail, and with further reference to FIGS. 4-6. Although layer 120 is referred to as a "substrate" herein it will be understood that layer 120, which may indeed be a semiconductor wafer substrate, may also comprise other materials, such as an insulating layer or a semi-conductive layer, which may be a layer of a semiconductor wafer.

As described in further detail below, in an embodiment, fabricating mold 150 (Step 132) comprises Step 133 of applying a mold layer 121 onto a surface of a substrate 120, followed by Step 135 of selectively exposing portions of mold layer 121 to electromagnetic radiation, followed by Step 137 of dissolving non-radiated portions of mold layer 121, thereby creating "undercut" mold 150. Step 135 may comprise one or more different methods of selectively exposing portions of mold layer 121 to electromagnetic radiation, such as using known photolithographic techniques common to microfabrication that includes use of mask 123 (see FIG. 4), or other techniques, such as directing an electron beam at mold layer 121, or other techniques for generating and selectively irradiate portions of mold layer 121. In one embodiment of Step 135, and as will be described further below with respect to FIGS. 4-6, a mask 123 is positioned relative to mold layer 121. Electromagnetic radiation, or light, is radiated through mask openings 125 and light is exposed onto mold layer 121, thereby selectively exposing portions of mold layer 121 to electromagnetic radiation. In an embodiment, Step 137 comprises dissolving non-radiated or partially-radiated portions of mold layer 121, thereby creating "undercut" mold 150 on substrate 120.

In an embodiment, and as explained further below, fabricating mold 150 yields a mold that comprises negatively-sloped ("undercut") sidewall profiles. The sidewall profile of magnetic core mold 150 is what makes the self-patterning properties of the process possible. Since the material of mold 150, in an embodiment, is a negative resist, which may be SU-8, a negative (undercut) side wall profile can be formed.

Figure 8:
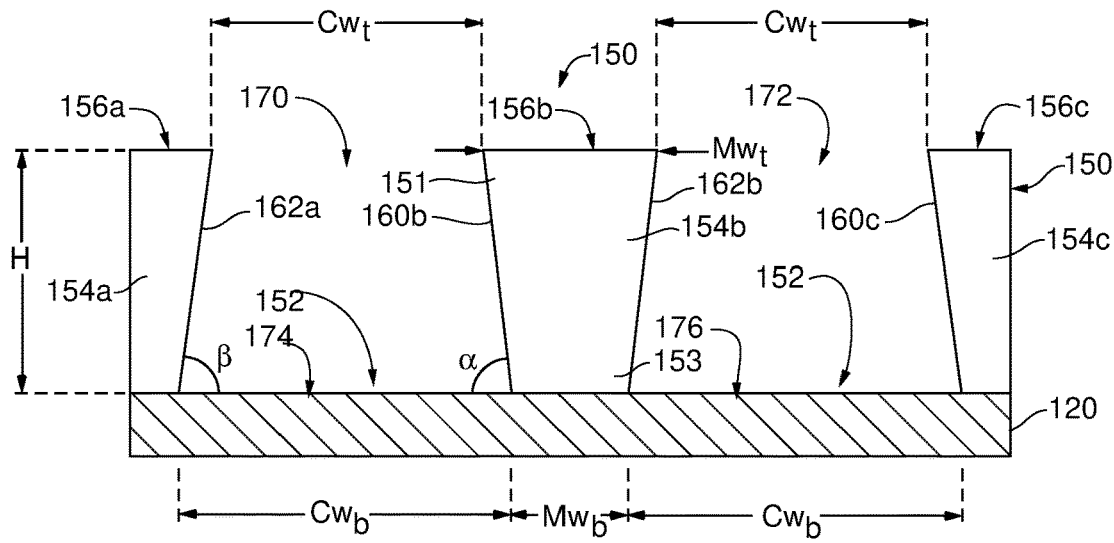
FIG. 8 is a cross-sectional view of FIG. 7, according to an embodiment of the disclosure.

Referring specifically to the process steps of FIG. 3 and the depicted structures of FIGS. 4 and 5, a mold layer 121 is applied to surface 152 of substrate 120 (Step 133). In an embodiment employing photolithographic techniques, mask 123 is positioned relative to mold layer 121, followed by irradiating mold layer 121 through opening 125 of mask 123 (Step 135). FIG. 4 is a schematic top-view depiction of a mask 123 positioned over a mold layer 121, on a surface of a substrate 120, prior to irradiation. FIG. 5, and subsequent FIGS. 6 and 8 depict substrate 120, mold layer 121 and subsequent mold 150 in cross section.

In an embodiment, mold layer 121 comprises a negative-photoresist material (also referred to herein as a "negative resist") and is applied to, or fabricated on, substrate 120. In an embodiment, mold layer 121 may comprise the material known as SU-8, which is an epoxy-based negative photoresist. As will be understood by those of ordinary skill when SU-8 photoresist is exposed to ultraviolet (UV) light, cross-linking or polymerization of the material results.

As mentioned above, or any variety of known negative-resist materials and formulations may be used, as will be understood by those of ordinary skill in the art.

Referring specifically to FIG. 5, Step 135 comprising selectively exposing portions of mold layer 121 to electromagnetic radiation is depicted. In this embodiment that employs photolithography, mask 123 with opening 125 is positioned above mold layer 121. In an embodiment, and as depicted, mask 123 may be substantially opaque to light 127, and particularly UV light, such that mask 123 does not allow light to substantially pass through. Electromagnetic radiation, which in an embodiment is in the form of light 127 (depicted as arrows), which may include ultraviolet (UV) light, is generated and directed through opening 125 between portions of mask 123 so as to impinge on mold layer 121. Light 127 penetrates mold layer 121 into exposed region R and energy is absorbed.

In the embodiment wherein mold layer 121 comprises a negative resist, those portions of mold layer 121 that are exposed to and absorb light 127, in selected areas defined by a mask 123, for example, mold portions 150*a*, 150*b* and 150*c*, undergo a chemical reaction, such as polymerization or cross linking, that changes the property of those exposed portions of mold layer 121. In the case of a negative resist, including SU-8, those portions absorbing light 127 undergo a reaction which causes the material of those portions to be "strengthened" or be relatively more resistant to a dissolving solution applied in a subsequent step, as explained further below.

Figure 7:
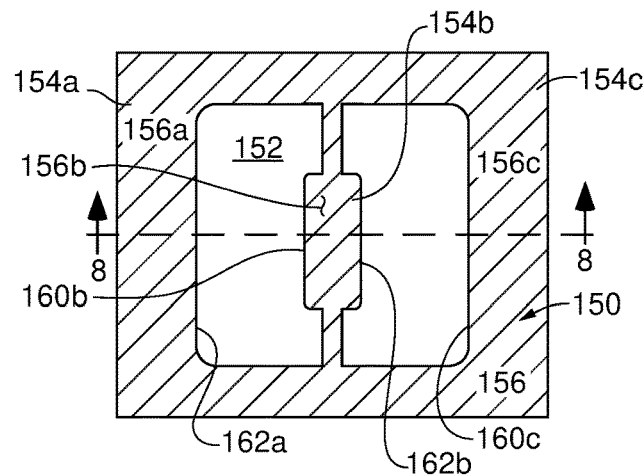
FIG. 7 is a top view of a mold fabricated on a surface, according to FIGS. 2-6.

As described further below, after removal of non-radiated portions of mold layer 121, remaining mold portions 150*a*, 150*b* and 150*c* are referred to as "walls" or wall portions 154*a*, 154, *b* and 154*c*, respectively, as depicted in FIG. 7. As also explained further below, as a result of the photolithographic process, wall portions 154*a*, *b* and *c* are generally sloped, or not perpendicular to surface 152 of substrate 120.

Diffraction and light scattering make it practically impossible to create perfectly straight sidewalls using photolithography. There will be areas with partially exposed resist at the edges of features. The rate of dissolution of partially irradiated resist will vary by process and resist material and can be referred to as contrast. High contrast resists and processes yield straighter sidewalls than low contrast resists. Although it should be noted that contrast is also influenced by processing conditions as well as the resist material.

Further, it will be understood that more energy from light 127 will be absorbed at top portion 143 of mold layer 121 as compared to bottom portion 145 of mold layer 121, as energy is absorbed by the material of mask 127 as it "travels" through the mold layer 121 material from top to bottom. As a result, at the edges of features, where the mold layer 121 resist is not fully exposed, it is understood that top portion 143 of mold layer 121 is more fully exposed than bottom portion 145 of mold layer 121. Therefore, there will be a gradient of dissolution rate within the thickness of the resist at the edges of features. This gives rise to the sidewall profiles depicted. In another embodiment that employs gray-scale photolithography, not depicted, mask 123 is not entirely opaque, and allows some light 127 to pass through it. In this embodiment, mask 123 includes end or edge portions 147 that allow varying degrees of light 127 to pass through. In an embodiment, portions 147 that allow some light 127 to pass through mask 123 are located proximal to, or adjacent to gap 125, while those portions allowing substantially no light 127 to pass through mask 123 is located distal to gap 125, which may be in a middle of mask 123.

FIG. 6 schematically depicts the results of selectively exposing mold layer 121 to light 127 through mask 123, according to an embodiment. After exposure to light 127, mold layer 121 comprises radiated or exposed portions 150, which includes portions 150*a*, 150*b* and 150*c* as depicted, and non-radiated or non-exposed portions 153, which includes portions 153*a* and 153*b* as depicted. In the embodiment wherein mold layer 121 comprises a negative resist, exposed portions 150 undergo the chemical reaction described above, forming "hardened" or "strengthened" portions, such as portion 150*a*, *b* and *c*.

Referring also to FIGS. 3, 7 and 8, at Step 137, soluble non-radiated or non-exposed portions 153 (including 153*a* and 153*b*) of mold layer 121 are dissolved, leaving mold wall portions 154 (including wall portions 154*a*, 154*b* and 154*c*), comprising the exposed, cross-linked portions of mold layer 121. Dissolving non-exposed portions 153 of mold layer 121 may be accomplished using known photolithography techniques, including dissolving with a developer or solvent.

As such, "mold" 150, which includes mold wall portions 154 is fabricated on surface 152 of substrate 120.

Referring specifically to FIGS. 7 and 8, an embodiment of mold 150 on substrate 120 is depicted. FIG. 7 is a top view of an embodiment of mold 150 on substrate 120, while FIG. 8 is a cross-sectional view of mold 150 on surface 152 of substrate 120. As described above, in an embodiment, mold 150 comprises a plurality of vertical wall portions 154, depicted as wall portions 154a, 154b and 154c. Due to the mold-fabricating process as described above, top portions 151 of mold wall portions 154 have a top mold wall portion width $MW_t$ that is generally wider than, or greater than, a bottom mold wall width $MW_b$.

As will be described further below, each magnetic core 102 is fabricated via layering between pairs of wall portions 154. Although only a single mold 150 is depicted, it will be understood that embodiments of the invention include multiple molds 150 fabricated on a surface of a common insulating layer or substrate 120, which layer, in an embodiment, may comprise a wafer substrate, so as to facilitate high-volume production of magnetic cores 102.

In the embodiment depicted, mold 150 on substrate 120 is structured such that the fabricated magnetic core 102 will have a gap, such as gap G1 or G1 (see also FIG. 1), at each end.

Mold 150 defines horizontally-extending top surface 156, which includes top surfaces 156a, 156b, and 156c of respective wall portions 154a, 154b, and 154c.

Each wall portion 154, including depicted wall portions 154a, 154b and 154c projecting generally vertically from surface 152 of substrate 120. Wall portion 154a includes second sidewall 162a, wall portion 154b includes first sidewall 160b and second sidewall 162b, and wall portion 154c includes first sidewall 160c. First and second sidewalls 160 and 162 extend generally upward and away from surface 152 at an angle as described further below.

Each first sidewall 160 forms an angle α with respect to surface 152 of substrate 120, and each second sidewall 162 forms an angle β with respect to surface 152 of substrate 120. In an embodiment that results in a symmetrically-formed magnetic core 102, angle α is the same as angle β. In the embodiment depicted, each of angle α and angle β are less than 90°, so as to form a "negative" sidewall profile, as explained further below.

Wall portions 154a and 154b of mold 150 define first cavity 170, and wall portions 154b and 156c define second cavity 172. In an embodiment wherein a magnetic core 102 includes only one gap, or no gaps, not depicted, first cavity 170 and second cavity 172 define a single integral cavity.

As explained further below, materials layered into first cavity 170 will create a first-half portion of a magnetic core 102, and materials layered into second cavity 172 will form a second-half portion of the magnetic core 102. Cavity 170 is defined at least in part by sidewall 162a and sidewall 160b, and by substrate-surface portion 174 (which is a portion of substrate top surface 152); cavity 172 is defined at least in part by sidewall 162b and sidewall 160c and by substrate-surface portion 176 (which is a portion of substrate top surface 152). Each of cavities 170 and 172 includes top width Cwt, which is a width of the opening of the cavity, and a bottom width Cwb. Bottom width Cwb is a width of each cavity at substrate-surface portions 174 and 176. In the depicted negative-profile embodiment, when bottom width Cwb is larger than top width Cwt each of sidewalls 160 and 162 forms a "negative" profile. A height of cavity 170 is defined by height H of its corresponding wall portions. Height H may vary in dimension, and may be determined by such factors as desired magnetic core 102 size, including its thickness, quantity of layers of core 102, thickness of individual core layers, and even angles α and β.

Referring again to FIG. 2, after mold 150 is fabricated on substrate 120 per step 132, selected horizontal mold 150 surfaces are metallized at step 134. Metallization may be accomplished with an evaporative seed.

Figure 9:
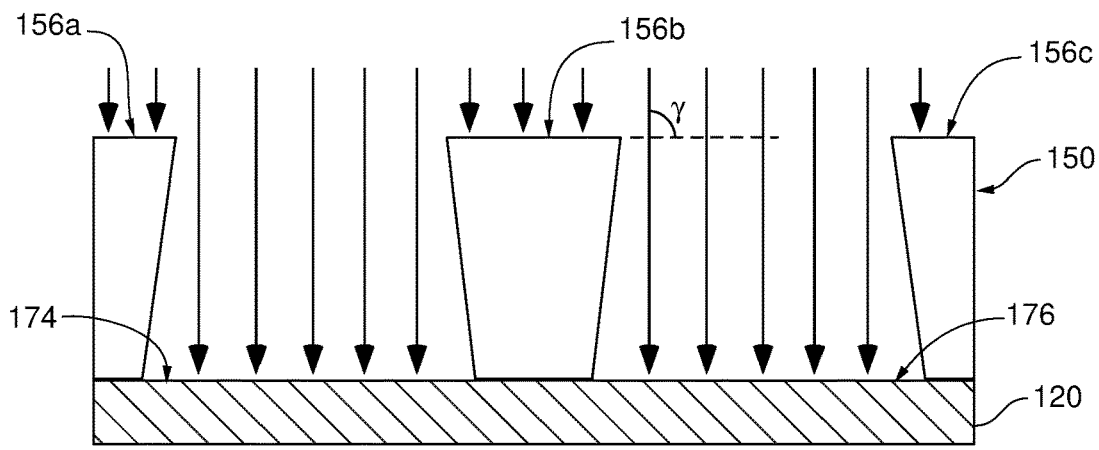
FIG. 9 is a cross-sectional view of the mold of FIGS. 7-8 depicting a conductive seed layer being added, according to an embodiment of the disclosure.
Figure 10A:
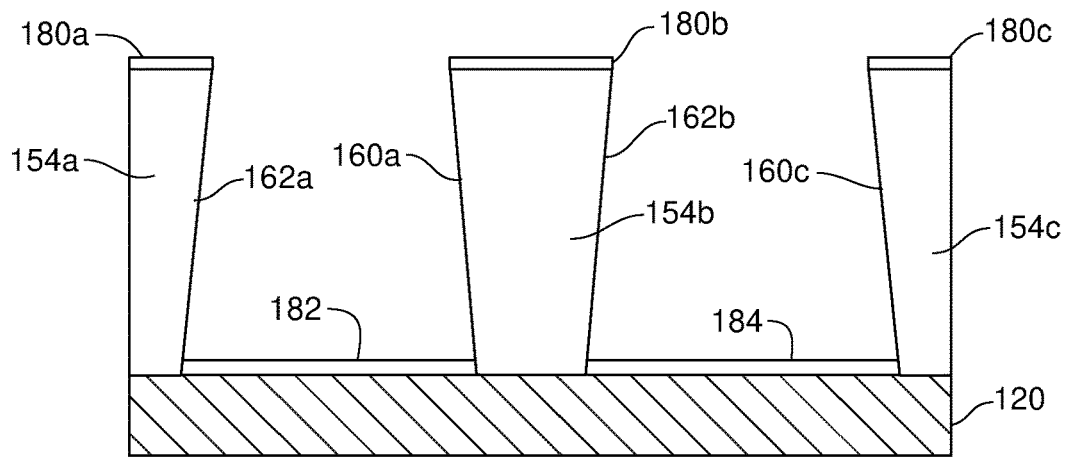
FIG. 10A is a schematic depiction of the mold of FIG. 9, with a conductive layer of a magnetic core, according an embodiment of the disclosure.

Referring to FIGS. 9 and 10A top surface 156 of mold 150, including top surfaces 156a, 156b and 156c (see also FIG. 4), as well as all or some portions of surfaces 174 and 176 of substrate surface 152 are metallized with an evaporative seed 178 (depicted as arrows), forming conductive layers 180a, 180b and 180c on top surfaces 156a, 156b and 156b of wall portions 154a, 154b and 154c, respectively, and forming conductive layers 182 and 184 on surfaces 174 and 176 (of substrate 120 surface 152), respectively, of substrate 120. The sidewall profile of mold 150 resist prevents side walls 160 and 162 from being metallized and keeps the seed (metal) on surfaces 156, 174 and 176 electrically isolated.

In an embodiment, evaporative seed material 178 and hence conductive layers 182 and 184 comprise a copper material, though other metals, including magnetic metals, e.g., permalloy, may be used. In an embodiment, and as explained further below, seed material 178 may be the same as a plated magnetic material layered on top of conductive layers 182 and 184.

Step 134 of metallizing or seed deposition needs to be very anisotropic. The angle of incidence for metal deposition, depicted as angle γ, needs to be as close to perpendicular as possible to prevent side wall 160 and 162 coverage of conductive metal material. As such, in an embodiment, angle of incidence γ is 90°; in another embodiment, angle γ is in a range of 89° to 90°. In other embodiments, angle γ may be less than 89°, when top mold wall portion width MWt is significantly larger than bottom mold wall portion width MWb, which means that angles α and β are particularly small. In one such embodiment, angle γ is greater than angles α and β. This differs from typical known procedures which strive to deposit metal on the mold walls using a diffuse deposition pattern.

A highly-anisotropic deposition may best be accomplished in a high-vacuum evaporation process, but may also be possible using sputtering processes that are optimized for this purpose. Systems of the invention include special fixtures that allow wafers to be loaded in the correct orientation in the evaporation chamber.

The process of seeding portions of substrate 120, and top surfaces 156 of mold 150 while avoiding coating sidewalls 160, 162 contrasts sharply to typical semiconductor manufacturing in which it is generally desirable to coat surfaces of sidewalls of the mold.

Figure 10B:
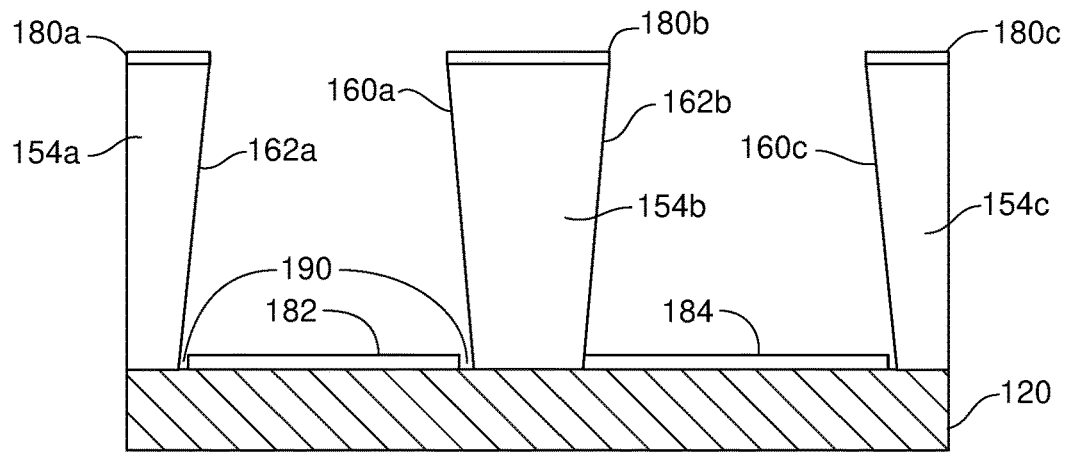
FIG. 10B is a schematic depiction of the mold of FIG. 9, with a conductive layer of a magnetic core, according another embodiment of the disclosure.

As depicted in FIG. 10A, metallized conductive layers 182 and 184 extend up to, and contact respective sidewalls 160 and 162. In an alternate embodiment, as depicted in FIG. 10 B, due to perpendicularly applied seed layer, a small portion of surfaces 174 and 176 (see also FIG. 10) may not be metallized, leaving small gaps 190 between conductive layers 182, 184 and adjacent sidewalls, i.e., between layer 182 and sidewalls 162a and 160a, and between layer 184 and sidewalls 162b and 160c. The resulting gaps 190 may be filled in during the metal plating step 136, as described below.

Figure 11:
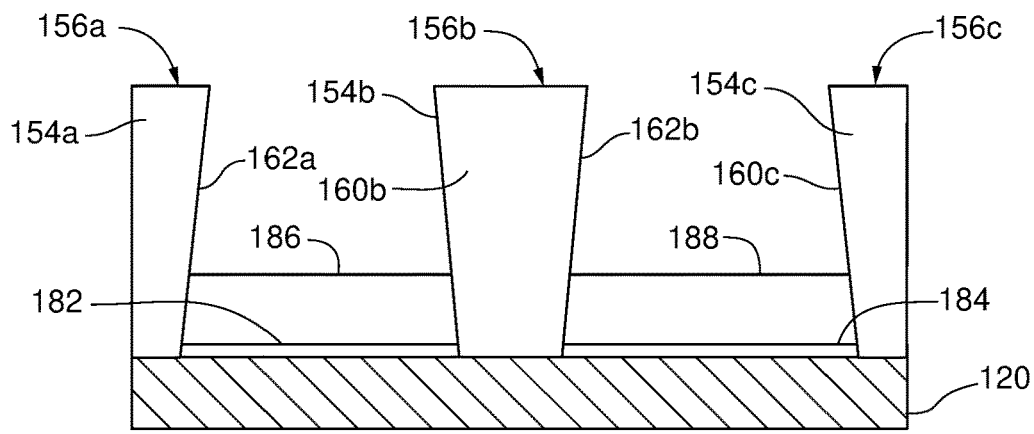
FIG. 11 is a schematic depiction of the mold with partial magnetic core of FIG. 10A, with a magnetic layer added to the magnetic core, according an embodiment of the disclosure.

Referring again to FIG. 2, and to FIG. 11, at step 136, a plating and de-plating step is simultaneously performed. In this step, conductive layers 182 and 184 are used to plate magnetic core 102 with a magnetic material. During this electroplating step, power is applied to conductive layers 182 and 184, and thin layers of magnetic metal plating 186 and 188 ("magnetic layers" 186 and 188) are formed on conductive layers 182 and 184, respectively. During this plating process, no power is applied to conductive layers 180 on top surfaces 156*a*, *b*, and *c* of mold 150, i.e., layers 180*a*, *b* and *c*, which results in deplating of mold 150, i.e., metal layers 180*a*, *b* and *c* are dissolved. As long as metal layers 180*a*, *b* and *c* are not powered, a reaction, which may be an anodic reaction, occurs during electroplating which de-plates (dissolves) the seed material of conductive layers 180*a*, *b* and *c* into the plating solution. Thus, this process step advantageously allows magnetic core 102 to be plated only within the core mold 150 on conductive layers 182 and 184 where the metal seed material is powered. The result of this process of plating/deplating is a "self-patterned" magnetic core 102.

The magnetic material of magnetic layers 186 and 188 may comprises any of the plated magnetic materials of Table I, though it will be understood that the magnetic material is not limited to those magnetic materials recited in Table I. In an embodiment, magnetic layers 186 and 188 include an alloy of nickel and iron. In one such embodiment, magnetic layers 186 and 188 comprise a permalloy material, such as a permalloy material comprising 80% nickel and 20% iron. In other embodiments, the magnetic material may comprise nickel, iron and cobalt alloys.

Figure 12:
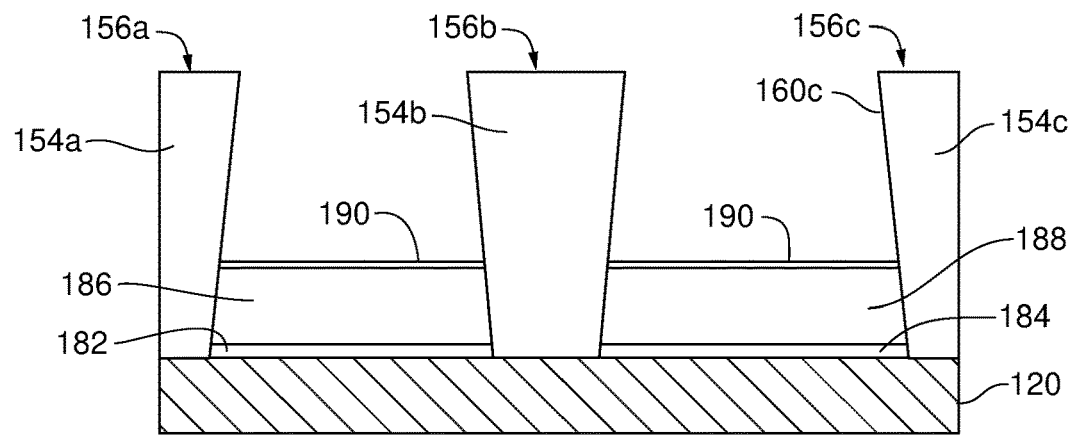
FIG. 12 is a schematic depiction of the mold with partial magnetic core of FIG. 11, with an adhesion layer added to the magnetic core, according an embodiment of the disclosure.
Figure 13:
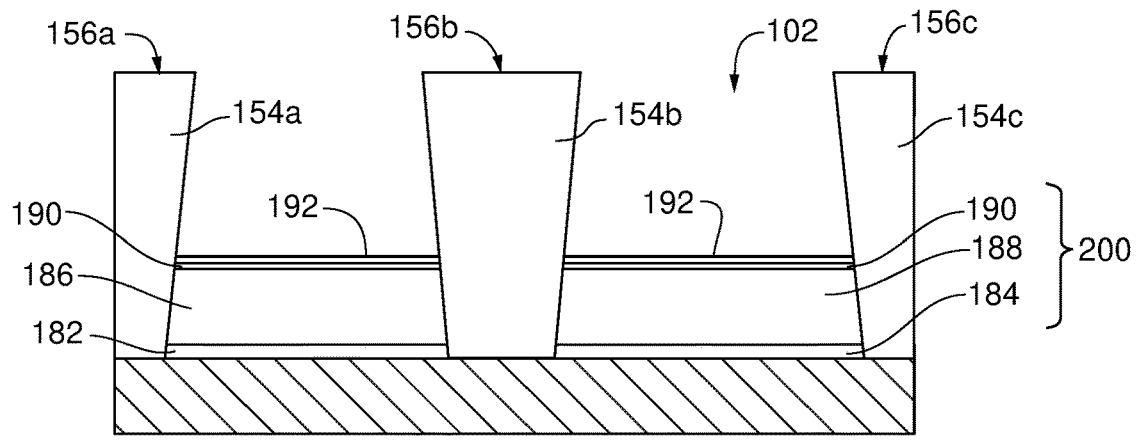
FIG. 13 is a schematic depiction of the mold with partial magnetic core of FIG. 12, with an insulating-sealing layer added the magnetic core, according an embodiment of the disclosure.

Referring again to FIG. 2, and to FIGS. 12-13, at step 138, an adhesion layer 190 is applied, and at step 140, a sealing layer 192 is applied. Adhesion promotion is required for many insulators to adhere well to plated cores. In embodiments, adhesion layers can be deposited with the sealing layer during the same vacuum deposition process or during a separate vacuum and/or chemical process. In an embodiment, magnetic layers 186 and 188 of magnetic core 102 are oxidized using a black oxide dip chemistry, followed by a silane-based adhesion promotion dip, such as silane A-174, prior to forming an insulating and sealing layer, thereby forming adhesion layer 190 on each of magnetic layers 186 and 188.

In some embodiments, depending on the particular material of insulating and sealing layer 192, applying an adhesion layer 190 via step 138 may not be necessary.

In an embodiment, an insulating and sealing material layer 192 is deposited on each of the adhesion layers 190. In an embodiment, the insulating and sealing material is parylene which is deposited on adhesion layer 190 via a deposition process.

Insulating and sealing material layer 190 provides galvanic isolation between adjacent core 102 laminations, e.g., between magnetic layer 186 and subsequent laminations/layers plated thereon, and between metal layer 188 and subsequent laminations/layers plated thereon. The insulating and sealing material needs to be resistant to the plating bath chemistry used for plating the core laminations/layers 186 and 188. Ideally, the insulating and sealing material will be conformally coated around magnetic core 102 to provide maximum galvanic isolation. These requirements make chemical vapor deposition (CVD) an optimal method of deposition due to its ability to deposit insulator, such as silicon dioxide (SiO2) or parylene, and its conformal coating capability. In an embodiment, the insulating and sealing material of layer 192 comprises parylene due to its high resistivity, chemical compatibility, conformal coating. Parylene is also advantageous in that it can be applied at room temperature, whereas many other CVD dielectrics need to be deposited at several hundred degrees Celsius. Such temperatures may not be compatible with some embodiments of the photoresist molds 150 herein.

Alternatively, insulating and sealing layer 192 may comprise PECVD SiO2 (plasma enhanced chemical vapor deposited silicon dioxide), or PVD (physical vapor deposited) dielectrics such as sputter or evaporated SiO2, at lower temperatures.

In an embodiment, insulating-sealing layer 192 is deposited so as to have a substantially uniform thickness that is in a range (0.1 um-100 um). In an embodiment, insulating-sealing layer 192 is in a range of 0.1 um to 5 um thick. In one embodiment, wherein insulating-sealing layer 192 comprises parylene, insulating-sealing layer 192 is approximately 1.5 um thick.

In order to keep the energy density high and the core device size small, it is desirable to have magnetic core 102 to have as high a magnetic saturation as possible. However, insulating-sealing layer 192 dilutes the magnetic saturation, such that as layer 192 thickness is increase, magnetic saturation is decreased for a fixed core size. For example a laminated core with a 1.5 Tesla material that has 4 um laminations with 1 um insulating layers is 80% magnetic material, so will behave like a 1.2 Tesla core.

Further, the thickness of layer 190 may be determined or selected based in part on operating frequency. Displacement currents form in thin insulators at ultra-high frequencies that can negate the effectiveness of laminations. If magnetic core 102 is expected to operate at a high enough frequency to cause displacement currents, then insulating-sealing layer 192 may be increased to maintain isolation, at the expense of magnetic saturation.

In an embodiment, when forming insulating sealing-sealing layer 192, the conformal coating, which may be parylene, also coats portions of mold 150 during deposition. This is expected and will not create a problem with further processing. After the entire core lamination sequence is completed, the parylene coating (or other insulating-sealing material) on the top surfaces of mold 150 can be removed by plasma etching with an oxygen plasma.

In an alternate embodiment, layers 190 and 192 may be applied in a single step, or layer 192 may be applied without first applying an adhesion layer 190 if the materials of insulating-sealing layer will adequately adhere to magnetic layer 186/188.

Referring again to FIG. 2, at step 142, if additional layers are desired, steps 134 to 140 are repeated, until multiple-layer/lamination core 102 is completed at step 144. In an embodiment, core 102 includes only one conductive seed layer 182/184, one magnetic layer 186/188, one adhesion layer 190 and one insulating-sealing layer 192, i.e., one "lamination" 200 or "lamination layer"200 consisting of a conductive layer 182/184, magnetic layer 186/188, an optional adhesion layer 190 and an insulating-sealing layer 192. In other embodiments, ultra-miniature magnetic core 102 includes a plurality of laminations, made up of a plurality of magnetic layers 186/188, a plurality of adhesion layers 190 and a plurality of insulating-sealing layers 192.

In an alternate embodiment, method 130 may also comprise fabricating a second mold 150 on top of a single or multi-lamination core fabricated using steps 132 to 142. In such an embodiment, steps of 132 through 142 are repeated, with mold 150 and the subsequent second core being fabricated on top of an insulating-sealing layer of the first laminated core. In such an embodiment, the second substrate 120 is the insulating-sealing layer of the first laminated core.

Figure 14:
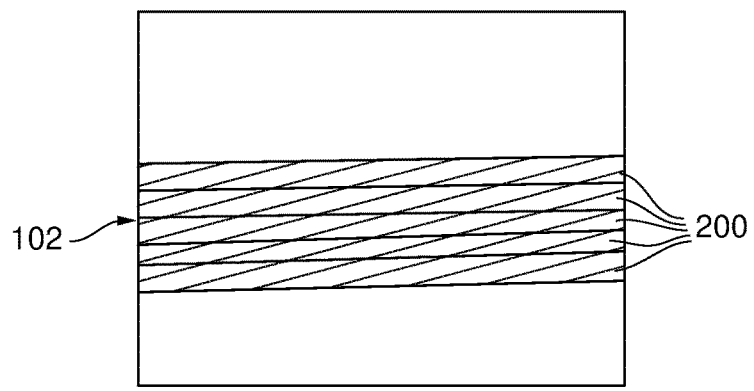
FIG. 14 is a cross-sectional photograph of a magnetic core having five core laminations, according to an embodiment of the disclosure.

In an embodiment of a core 102 having a plurality of laminations, and referring to FIG. 14, which is a photograph of a magnetic core of the present disclosure, ultra-miniature magnetic core 102 includes five lamination layer 200. The quantity of lamination layers 200 per core 102 may vary depending on the desired characteristics of magnetic core 102, including desired core size.

Unlike known methods of manufacturing micro-fabricated magnetic cores, methods of manufacturing magnetic cores 102 as described herein avoid repetitive photolithographic steps to fabricate a laminated core, thereby significantly reducing costs and decreasing fabrication times, in addition to producing significantly improved performance characteristics. Further, methods of the invention allow the fabrication of cores 102 having a greater number of laminations that are extremely thin.

After fabrication of a magnetic core 102 in mold 150 according to the steps described above, in an embodiment, the magnetic core 102 is separated from the mold 150. In other embodiments, further fabrication steps may be applied to core 102 and mold 150 so as to form a device 100 that includes magnetic core 102.

Figure 15:
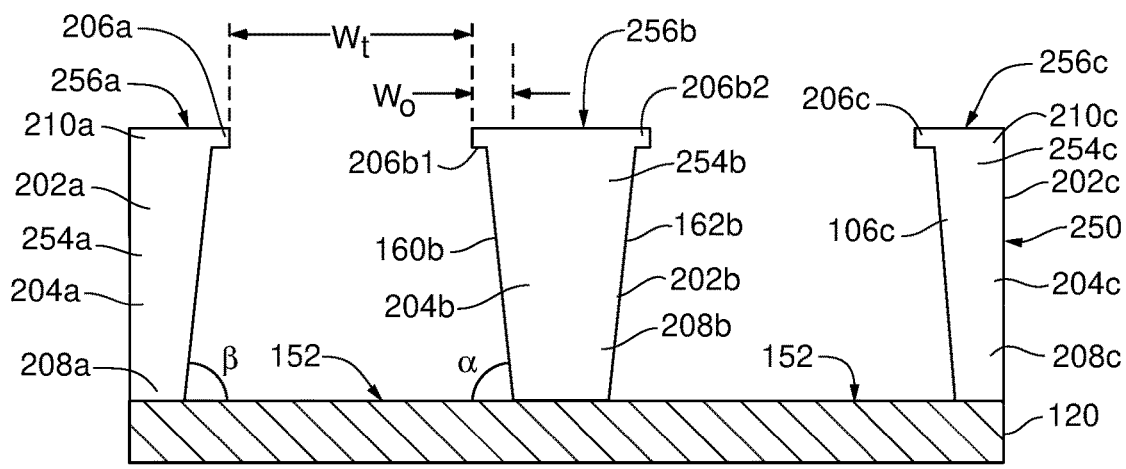
FIG. 15 is a cross-sectional schematic depiction of a T-top mold on a substrate, according to an alternate embodiment of the disclosure.
Figure 16:
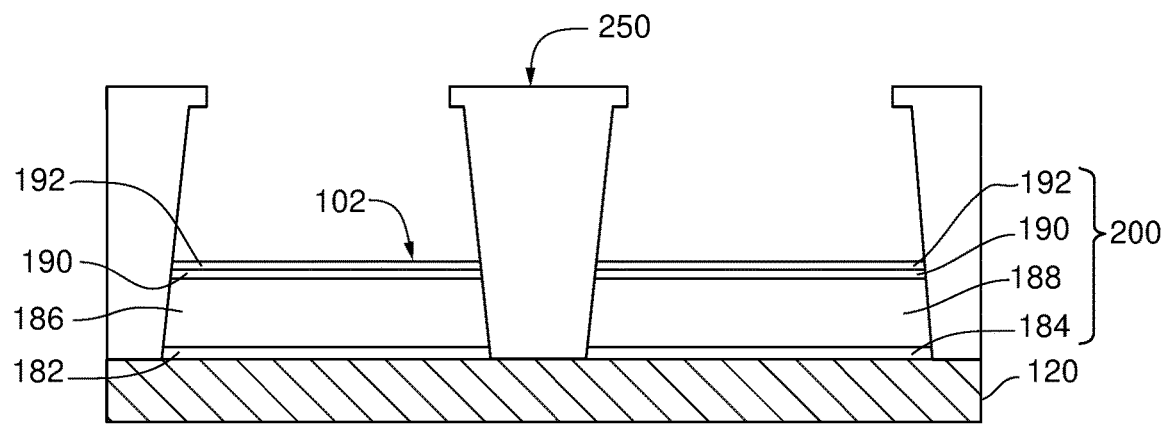
FIG. 16 is a cross-sectional schematic depiction of the T-top mold of FIG. 15, with a magnetic core, according to an embodiment of the disclosure.

Referring to FIGS. 15-16, an alternate embodiment of a mold, labeled as mold 250, is depicted. As described above with respect to FIGS. 7-14, the sidewall profiles of mold 150 enable the self-patterning properties of the core 102 fabrication process. Substantially linearly sloped sidewalls with negative profiles that define mold cavities 170 and 172 having base/bottom widths that are larger than top/opening widths, such as sidewalls 160 and 162, avoid sidewall metallization, and enable isolation of core layers as described above. In other embodiments, such as the one depicted in FIGS. 15-16, sidewalls 160 and 162 of mold 150 continue to define linear negative profiles such as those of FIG. 7 and related figures, but with additional structural features in the form of horizontal projections or overhangs at the top of the sidewalls, which further ensure that the sidewalls are not metallized. In one such embodiment, as depicted in FIGS. 15-16, mold 250 defines mold wall portions 254 that form T-shaped structures that also yield mold cavities that enable methods of the present invention.

Referring specifically to FIG. 15, mold 250 is substantially similar to mold 150, except for the addition of horizontally-projecting "overhang" portions 206. In this "T-top" embodiment, each vertical wall portion 254 forms a "T" shape, and includes base portion 204 and one or two projecting or overhang portions 206 extending perpendicularly from base portion 204. In FIG. 15, three vertical mold wall portions 254 are depicted, namely 254a, 254b and 254c. Mold wall portion 254a includes base portion 204a and first overhang portion 206a; mold wall portion 254b includes base portion 204b, first overhang portion 206b1 and second overhang portion 206b2; mold wall portion 254c includes base portion 204c and first overhang portion 206c. For the sake of simplicity, only three vertical walls 202 are depicted, though it will be understood that many more molds 250 and their respective vertical walls 254 will be present on a wafer during mass production of ultra-miniature magnetic cores 102. Further, only one overhang 206 for each of walls 202a and 202c are depicted also for the sake of simplicity, though walls 202a and 202c could have two overhang portions 206 each in the case of multiple molds, depending on their location on the wafer.

As depicted, each base portion 204, including base portions 204a, 204b and 204c, projects slopes upward and away from surface 152 of substrate 120, and each includes a bottom portion 208 (208a, b, and c, respectively) proximal to surface 152, and a top portion 210 (210a, b, and c, respectively) distal to surface 152. Overhang portions 206 each extend transversely from their respective base portion 204 at or near their respective top portion 210. Top surfaces of each overhang 206 and its respective base 204 form mold 250 top surfaces 256, including top surface 256a, 256b and 256c. In an embodiment, and as depicted, each overhang 206 projects transversely from its respective base portion 204.

Each base portion 204 also includes a sidewall 160 and a sidewall 162, such that, in the embodiment depicted, base portion 204a includes sidewall 162a, base portion 204b includes sidewalls 160b and 162b, and base portion 204c includes sidewall 160c. Each base portion 204 project transversely to surface 152 of substrate 120, each defining an angle α, which in an embodiment, and as depicted, is less than 90°. Each sidewall 162 also projects transversely to surface 152 of substrate 120, each defining an angle β, which in an embodiment, and as depicted, is less than 90°. In an embodiment angles α and β are the same or substantially the same; in an embodiment, angles α and β are both less than 90°.

T-top vertical wall portions 202 may be formed in a variety of ways, including by way of a two-step or greyscale photolithography exposure process, or by way of AZ9260 or a LOR (lift-off resist) resist process. T-top mold 250 may be formed similarly to mold 250, but with some differences that include multiple masks and varying exposure time. In one embodiment wall portions 254 of T-top mold 250 are formed with a two-stage exposure, using two generally UV-opaque masks 123 with slightly different line widths and defining different gaps 125. In an embodiment, a difference in line width, and hence gap 125, is 30 um. Using a shorter exposure time for the second, wider line width (smaller gap) T-Topped wall portions 254 can be formed. With this process, the "T" projections 206 are exposed to less light than other portions of mold 250, including portions 210.

T-Topped structures 254 are also possible using a single "greyscale" mask that allow varying amounts of light to penetrate different portions of the mask, using greyscale photolithography.

After fabrication of T-top mold 250, the process of fabricating laminated magnetic cores 102 is substantially the same as described above with respect to FIGS. 2-13, including metallizing mold and substrate surfaces, plating/deplating, and applying an adhesion and insulating-sealing layer to form each core 102 layer. Referring to FIG. 16, a magnetic core 102 with a single core lamination layer 200 fabricated using T-top mold 250 that is substantially the same as the core 102 described above with respect to FIGS. 2-14, is depicted. Similar to magnetic cores 102 fabricated with mold 150, the core 102 of FIG. 16 includes conductive layers 182/184, magnetic layers 186/188, adhesion layer 190 and insulating-sealing layer 192.

Four-point probe measurements have verified that galvanic isolation between core laminations 200 is maintained when insulating-sealing layer 192 is a parylene layer of 1.5 um thick. In other embodiments that further minimize lamination thickness, parylene layers that are less than 1.5 um may be used.

Fabrication of magnetic cores 102 manufactured according to methods of the invention have yielded cores with a saturation flux density of 1.5 T, coercivity of 1 Oe, and a resistivity of 500 μΩcm at a thickness of 50 microns. These results are significant because they allow the targeted core 102 specifications to be reached with a lamination thickness of 5 um per layer. Furthermore, the self-patterning nature of the process keeps costs low by avoiding the excessive photolithography. The result is an economic, manufacturable process for creating efficient magnetic cores 102 for ultra-miniature magnetic devices.

As described briefly with respect to FIG. 1 above, ultra-miniature, high-performance magnetic cores 102 may be used as a key component in ultra-miniature, high-performance devices, including inductors and transformers, such as device 100. Devices with magnetic cores 102 may be fabricated using semiconductor technology and are therefore, suitable for automated production. This provides greater consistency, and hence greater quality control, and reduces manufacturing costs. As such, ultra-miniature cores 102 of the present invention are well-suited for many inductor and transformer applications including but not limited to computer data transmission, isolated DC-DC converters, boost, buck, SEPIC (single-ended primary-inductor converter) and CUK power supplies, voltage regulators, current regulators, actuators for isolated switches, Ethernet network transformers and other applications involving high frequency signals. Devices with magnetic cores 102, such as device 100 are also suitable for lower-frequency applications such as modem devices.

Device 100 can be readily adapted to provide a wide variety of electrical connections to suit the needs of various applications. Variations in the choice of methods for fabrication as well as choice of materials and sizes for magnetic core 102, conductors 112, and electronic layers yield predictably different electrical performance characteristics.

Table III below provides a comparison of a conventional transformer not manufactured according to methods of the present invention, and thus not having core laminations 200, to device 100 having a magnetic core 102 with laminations 200. Generally, both transformers are 2.5 W (watt), 5V DC-DC converter.

TABLE III

Non-Laminated vs. Laminated Transformer Performance

| Transformer Performance without Laminations | | Transformer Performance with Laminations | |
|---|---|---|---|
| $V_{out}$ | 4.96 Volts | $V_{out}$ | 5.00 Volts |
| $I_{out}$ | 496 mA | $I_{out}$ | 500 mA |
| $P_{out}$ | 2460 mW | $P_{out}$ | 2498 mW |
| $V_{Break\ Down}$ | 4480 Volts | $V_{Break\ Down}$ | 4480 Volts |
| $P_{loss}$ | 1421 mW | $P_{loss}$ | 197 mW |
| Efficiency | 63.4% | Efficiency | 92.7% |
| Ins Loss | −1.98 dB | Ins Loss | −0.33 dB |

Figure 17:
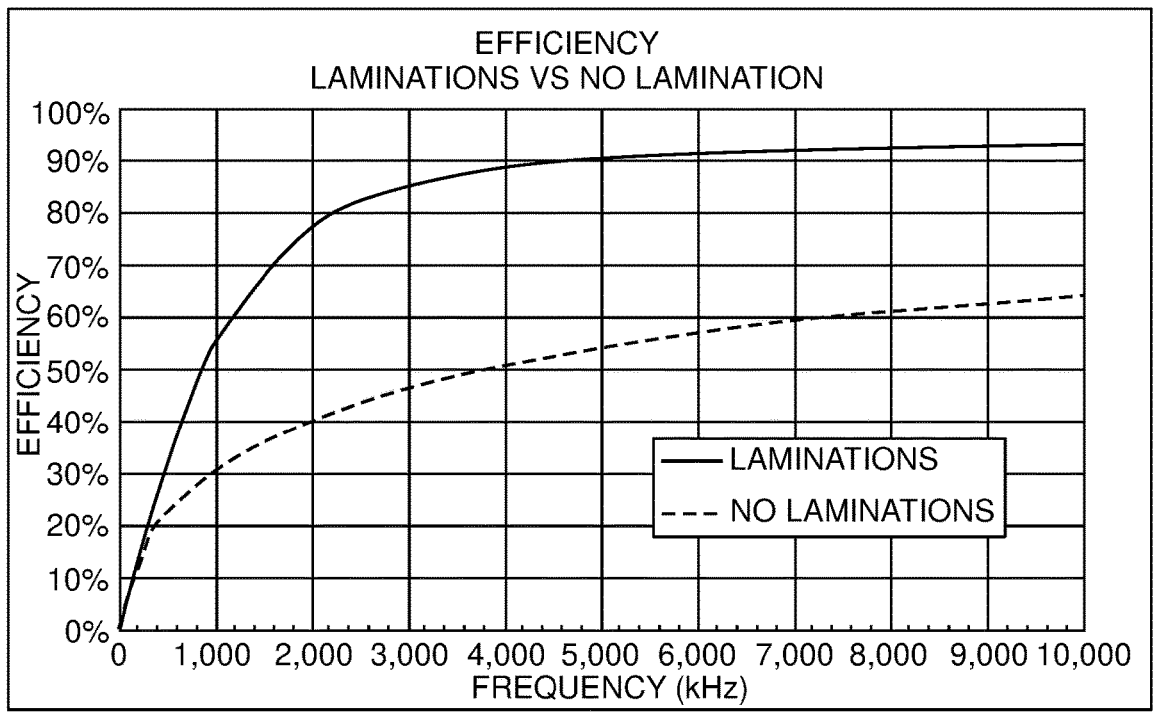
FIG. 17 is a graphical comparison of the efficiency of a device with a laminated magnetic core of the disclosure vs. a device with a traditional non-laminated magnetic core.

As can be seen from Table III, the transformer with laminations, fabricated according to methods of FIG. 2, demonstrate an efficiency of 92.7% as compared to an efficiency of 63.4% of the traditional, non-laminated transformer. FIG. 17 is a graph that depicts and describes in more detail the efficiency performance of the traditional non-laminated transformer vs. the novel laminated transformer of Table III. The abscissa or horizontal axis represents frequency, which ranges from 0 to 10,000 kHz; the ordinate, or vertical axis represents efficiency as a percentage ranging from 0 to 100%. As can be seen from FIG. 18, the laminated transformer demonstrates a significantly higher efficiency over all frequency ranges as compared to the non-laminated transformer.

Figure 18:
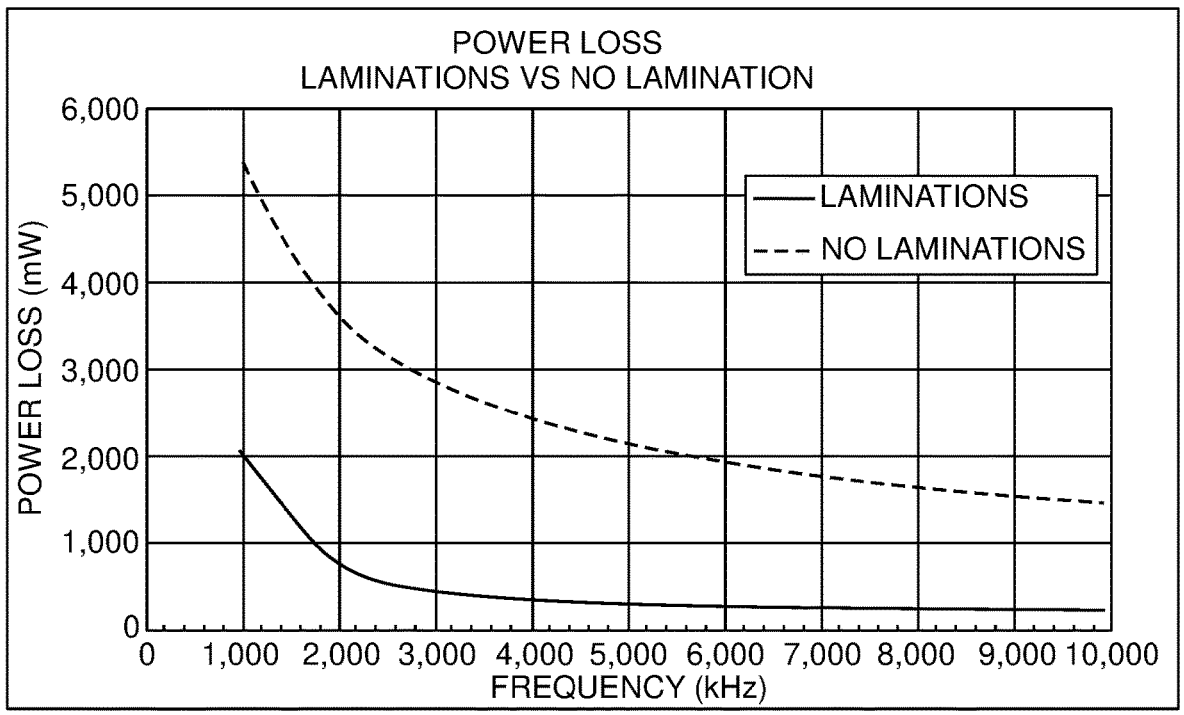
FIG. 18 is a graphical comparison of the power loss of a device with a laminated magnetic core of the disclosure vs. a device with a traditional non-laminated magnetic core.

As indicated in Table III, power loss is −0.33 dB for the laminated transformer, as compared to −1.98 dB for the non-laminated transformer. FIG. 18 is a graph that depicts and describes in more detail, power losses of the traditional non-laminated transformer vs. the laminated transformer of Table III. The abscissa or horizontal axis represents frequency, which ranges from 0 to 10,000 kHz; the ordinate, or vertical axis represents power loss in mW in a range from 0 to 6,000 mW. As can be seen from FIG. 18, the laminated transformer demonstrates a significantly lower power loss over all frequency ranges as compared to the non-laminated transformer.

Various modifications to the embodiments may be apparent to one of skill in the art upon reading this disclosure. For example, persons of ordinary skill in the relevant arts will recognize that the various features described for the different embodiments can be suitably combined, un-combined, and re-combined with other features, alone, or in different combinations. Likewise, the various features described above should all be regarded as example embodiments, rather than limitations to the scope or spirit of the disclosure.

Persons of ordinary skill in the relevant arts will recognize that various embodiments can comprise fewer features than illustrated in any individual embodiment described above. The embodiments described herein are not meant to be an exhaustive presentation of the ways in which the various features may be combined. Accordingly, the embodiments are not mutually exclusive combinations of features; rather, the claims can comprise a combination of different individual features selected from different individual embodiments, as understood by persons of ordinary skill in the art.

Unless indicated otherwise, references to "embodiment(s)", "disclosure", "present disclosure", "embodiment(s) of the disclosure", "disclosed embodiment(s)", and the like contained herein refer to the specification (text, including the claims, and figures) of this patent application that are not admitted prior art.

For purposes of interpreting the claims, it is expressly intended that the provisions of 35 U.S.C. 112(f) are not to be invoked unless the specific terms "means for" or "step for" are recited in the respective claim.

What is claimed is:

1. A method of fabricating a laminated magnetic core that includes a conductive layer, a magnetic layer, and an insulting-sealant layer, comprising:
    fabricating a magnetic-core mold on a surface of a substrate, the magnetic-core mold including a first wall portion having a first sidewall, a second wall portion having a second sidewall, the second sidewall located opposite the first sidewall, and a top portion, the first and second sidewalls and a portion of the surface of the substrate defining a mold cavity having a bottom width that is greater than a top width, the first and second sidewalls connecting the top portion of the mold to the surface of the substrate;
    depositing a conductive seed material on the mold top portion and on a portion of the surface of the substrate so as to form a conductive layer of the laminated magnetic core, wherein the conductive seed material is directed toward the mold top portion and the portion of the surface of the substrate, at an angle of incidence that substantially prevents deposition of the conductive seed material on the first and second sidewalls;
    forming a magnetic layer on a portion of the conductive layer that is formed on the portion of the surface of the substrate; and
    forming an insulating-sealing layer on the magnetic layer, thereby forming the laminated magnetic core having a first lamination layer that includes the conductive layer, the magnetic layer and the insulating-sealing layer.

2. The method of claim 1, wherein forming the magnetic layer on the portion of the conductive layer that is on the portion of the surface of the substrate comprises electroplating a magnetic material onto the portion of the conductive layer that is formed on the portion of the surface of the substrate.

3. The method of claim 1, wherein the first insulating-sealing layer on the magnetic layer comprises parylene.

4. The method of claim 3, further comprising applying an adhesive promoter to the magnetic layer, thereby forming an adhesion layer on the magnetic layer prior to adding the insulating-sealer layer.

5. The method of claim 4, further comprising oxidizing the magnetic layer with a black oxide, prior to applying the adhesive promotor.

6. The method of claim 1, further comprising adding a second lamination layer to the laminated magnetic core, including:
  depositing conductive seed material on the mold top portion and on the first insulating-sealing layer so as to form a conductive layer of the second lamination layer, wherein the conductive seed material is deposited at an angle of incidence that prevents deposition of the seed material on portions of the first and second sidewalls;
  forming a magnetic layer of the second lamination layer on a portion of the conductive layer of the second lamination layer that is formed on the first insulating-sealing layer; and
  forming an insulating-sealing layer of the second lamination layer on the magnetic layer of the second lamination layer, thereby fabricating a second lamination layer on the first lamination layer.

7. The method of claim 1, wherein the magnetic-core mold is formed using a photolithography process.

8. The method of claim 7, wherein the magnetic-core mold comprises a negative photoresist material.

9. The method of claim 8 wherein the negative photoresist material comprises SU-8.

10. The method of claim 1, wherein the first sidewall of the magnetic-core mold forms a first angle with the surface of the substrate and the second sidewall of the magnetic-core mold forms a second angle with the surface of the substrate, and each of the first angle and the second angle is less than 90°.

11. The method of claim 1, wherein fabricating the magnetic-core mold on the surface of the substrate includes fabricating a magnetic-core mold that is a T-top mold having horizontally-projecting portions located at tops of the first and second wall portions.

12. The method of claim 1, wherein a photolithography process is used to fabricate the magnetic-core mold, and is not used to form any of the conductive, magnetic and insulating-sealing layers of the first lamination layer.

13. The method of claim 12, further comprising forming a second lamination layer on the first lamination layer.

14. The method of claim 13, wherein a photolithography process is not used to form the second lamination layer of the magnetic core.

15. The method of claim 1, wherein the magnetic layer comprises a nickel-iron alloy, cobalt-iron alloy or a cobalt-nickel-iron alloy material.

16. A method of fabricating a magnetic device incorporating a laminated magnetic core fabricated using the method of claim 1.

17. The method of claim 16, wherein the magnetic device is a transformer, an inductor or a choke.

18. A method of fabricating a laminated magnetic core that includes a conductive layer, a magnetic layer and an insulating-sealing layer, comprising:
  fabricating a magnetic-core mold on a surface of a substrate using a photolithography process, the magnetic-core mold comprising a negative photoresist material and including a first wall portion having a first sidewall, a second wall portion having a second sidewall, the second sidewall located opposite the first sidewall, and a top portion, the first sidewall forming a first angle relative to the surface of the substrate, the second sidewall forming a second angle relative to the surface of the substrate, both the first angle and the second angle being less than 90';
  depositing a conductive seed material on the mold top portion and on a portion of the surface of the substrate between the first sidewall and the second sidewall so as to form a conductive layer of the laminated magnetic core;
  forming a magnetic layer on a portion of the conductive layer that is formed on the portion of the surface of the substrate between the first sidewall and the second sidewall;
  dissolving the deposited seed material on the mold top surface;
  applying an adhesive material to the magnetic layer; and
  forming a first insulating-sealing layer comprising parylene on the adhesive-coated magnetic layer, thereby forming the laminated magnetic core having a first lamination layer that includes the conductive layer, the magnetic layer and the insulating-sealing layer.

19. The method of claim 18, wherein forming the magnetic layer on the portion of the conductive layer that is formed on the portion of the surface of the substrate between the first sidewall and the second sidewall comprises electroplating magnetic material onto the portion of the conductive layer that is formed on the portion of the surface of the substrate between the first sidewall and the second sidewall.

20. The method of claim 18, further comprising oxidizing the magnetic layer with black oxide, prior to applying an adhesive promotor.

21. The method of claim 18, further comprising adding a second lamination layer to the laminated magnetic core, including:
  depositing a conductive seed material on the mold top portion and on the first insulating-sealing layer so as to form a conductive layer of the second lamination layer, wherein the seed material is deposited at an angle of incidence that prevents deposition of the seed material on portions of the first and second sidewalls adjacent to the first insulating-sealing layer;
  forming a magnetic layer of the second lamination layer on a portion of the conductive layer of the second lamination layer that is formed on the first insulating-sealing layer; and
  forming an insulating-sealing layer of the second lamination layer on the magnetic layer of the second lamination layer, thereby fabricating a second lamination layer on the first lamination layer.

22. The method of claim 18, wherein the negative photoresist material comprises SU-8.

23. The method of claim 18, wherein fabricating a magnetic-core mold on a surface of a substrate includes fabricating the magnetic-core mold that is a T-top mold having horizontally-projecting portions located at tops of the first and second wall portions.

24. The method of claim 18, wherein a photolithography process is used to fabricate the magnetic-core mold, and is not used to form any of the conductive, magnetic and insulating-sealing layers of the first lamination layer.

25. The method of claim 23, further comprising forming a second lamination layer on the first lamination layer.

26. The method of claim 25, wherein a photolithography process is not used to form the second lamination layer of the magnetic core.

27. The method of claim 18, wherein the magnetic layer comprises a nickel-iron alloy, cobalt-iron alloy or a cobalt-nickel-iron alloy material.

28. A method of fabricating a magnetic device incorporating a laminated magnetic core fabricated using the method of claim 17.

29. The method of claim 28, wherein the magnetic device is a transformer, an inductor or a choke.

* * * * *

UNITED STATES PATENT AND TRADEMARK OFFICE
CERTIFICATE OF CORRECTION

| | |
|---|---|
| PATENT NO. | : 11,749,455 B2 |
| APPLICATION NO. | : 17/571886 |
| DATED | : September 5, 2023 |
| INVENTOR(S) | : Cobian et al. |

It is certified that error appears in the above-identified patent and that said Letters Patent is hereby corrected as shown below:

On the Title Page

Column 1, Item (51), under "Int. Cl.", Lines 2-4, delete
"*H01F 41/02* (2006.01)
*G03F 7/00* (2006.01)
*H01F 1/147* (2006.01)".

In the Specification

In Column 8, Line 9, delete "154, b" and insert -- 154b, --, therefor.

In Column 10, Line 54, delete "10 B," and insert -- 10B, --, therefor.

In the Claims

In Column 17, Claim 3, Line 4, before "insulating" delete "first".

In Column 17, Claim 9, Line 35, delete "8" and insert -- 8, --, therefor.

In Column 18, Claim 18, Line 11, delete "90';" and insert -- 90°; --, therefor.

Signed and Sealed this
Fourteenth Day of November, 2023

Katherine Kelly Vidal
*Director of the United States Patent and Trademark Office*